(12) United States Patent
Sung et al.

(10) Patent No.: US 10,446,786 B2
(45) Date of Patent: Oct. 15, 2019

(54) DISPLAY DEVICE AND MANUFACTURING METHOD THEREOF

(71) Applicant: Samsung Display Co., Ltd., Yongin-si (KR)

(72) Inventors: Woo Yong Sung, Seoul (KR); Seung Ho Yoon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/991,656

(22) Filed: May 29, 2018

(65) Prior Publication Data

US 2019/0173048 A1 Jun. 6, 2019

(30) Foreign Application Priority Data

Dec. 5, 2017 (KR) .................. 10-2017-0166157

(51) Int. Cl.
*H01L 51/56* (2006.01)
*H01L 51/52* (2006.01)
*G09G 3/3258* (2016.01)
*G09G 3/3233* (2016.01)

(52) U.S. Cl.
CPC ....... *H01L 51/5237* (2013.01); *G09G 3/3233* (2013.01); *G09G 3/3258* (2013.01); *H01L 51/5206* (2013.01); *H01L 51/5221* (2013.01); *H01L 51/56* (2013.01)

(58) Field of Classification Search
CPC . H01L 51/5237; H01L 51/5206; H01L 51/56; H01L 51/5221; G09G 3/3233; G09G 3/3258
See application file for complete search history.

(56) References Cited

U.S. PATENT DOCUMENTS

| 9,054,327 B2 | 6/2015 | Kim et al. | |
| 2003/0025446 A1* | 2/2003 | Lin | H01J 1/74 |
| | | | 313/504 |
| 2014/0145171 A1 | 5/2014 | Park et al. | |
| 2015/0021567 A1* | 1/2015 | Ko | H01L 51/5246 |
| | | | 257/40 |
| 2015/0060786 A1 | 3/2015 | Kwak | |
| 2016/0336541 A1 | 11/2016 | Kim | |
| 2016/0365398 A1 | 12/2016 | Kim et al. | |
| 2016/0372703 A1 | 12/2016 | Khachatryan et al. | |

(Continued)

FOREIGN PATENT DOCUMENTS

| JP | 4520226 | 8/2010 |
| KR | 10-1398448 | 5/2014 |
| KR | 10-2015-0025260 | 3/2015 |

*Primary Examiner* — Kyoung Lee
(74) *Attorney, Agent, or Firm* — H.C. Park & Associates, PLC

(57) ABSTRACT

A display device includes: a substrate having a display area and a non-display area disposed around the display area; an organic light emitting diode disposed on the substrate in the display area; and a spacer disposed on the substrate in the non-display area, the substrate includes a first insulating film and a second insulating film disposed on the first insulating film, the substrate includes a groove disposed in an edge area farther from the organic light emitting diode than the spacer in the non-display area, and the groove is formed in at least one of the first insulating film and the second insulating film.

11 Claims, 12 Drawing Sheets

(56) References Cited

U.S. PATENT DOCUMENTS

| | | |
|---|---|---|
| 2016/0377770 A1 | 12/2016 | Kwon et al. |
| 2017/0033312 A1 | 2/2017 | Kim et al. |
| 2017/0110521 A1 | 4/2017 | Park et al. |
| 2017/0110532 A1 | 4/2017 | Kim et al. |
| 2017/0168338 A1 | 6/2017 | Bae et al. |
| 2017/0168346 A1 | 6/2017 | Kam et al. |

\* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2017-0166157, filed on Dec. 5, 2017, which is hereby incorporated by reference for all purposes as if fully set forth herein.

BACKGROUND

Field

Exemplary embodiments of the invention relate generally to a display device. More specifically, exemplary embodiments of the invention relate to a display device that includes a peripheral portion of a display area with a minimal width and an insulating layer that resists peeling in the peripheral portion of a display area and a method of manufacturing such a display device.

Discussion of the Background

A display device includes a liquid crystal display (LCD), a plasma display panel (PDP), an organic light emitting diode display (OLED), a field effect display (FED), an electrophoretic display device, etc.

A pixel of the organic light emitting diode display includes two electrodes and an organic emission layer disposed therebetween. An electron injected from a cathode which is one of the two electrodes and a hole injected from an anode which is the other of the two electrodes are combined in an organic emission layer to form an exciton, and the exciton emits light while emitting energy.

The pixel of the organic light emitting diode display may be deteriorated in performance when exposed to moisture or air. Thus, a thin film encapsulation layer including a plurality of thin films is formed on the display area where a plurality of pixels is disposed such that air or moisture does not penetrate from the outside to the pixels, thereby protecting the display area.

At this time, some thin films constituting the thin film encapsulation layer may be lifted off or peel in a peripheral area of the display area. In this case, air or moisture may be introduced from the outside through the lifted thin film layer. The peripheral area may be formed to have a wide width, so that a contact area between the thin film encapsulation layer and the substrate may be increased in order to prevent the thin film encapsulation layer from being lifted. However, there is an increasing demand for a bezel-less display device in which the non-display area around the display area is not visible to the user. To this end, it is necessary to narrow the width of the peripheral area of the display area.

The above information disclosed in this Background section is only for understanding of the background of the inventive concepts, and, therefore, it may contain information that does not constitute prior art.

SUMMARY

Display devices constructed according to exemplary embodiments of the invention are capable of preventing an encapsulation layer from being lifted off the substrate. For example, display devices according to exemplary embodiments may include a groove in an edge area of a non-display area of a substrate to increase the contact area and contact force between the substrate and an encapsulation layer disposed on the substrate.

Display devices constructed according to exemplary embodiments of the invention and method of manufacturing thereof are capable of preventing an insulating layer from being lifted off or peeling in a peripheral portion of a display area without increasing a width of a non-display area disposed around the display area of the display device. For example, display devices according to exemplary embodiments may include a groove in an edge area of a non-display area of a substrate to increase the contact area and contact force between the substrate and an encapsulation layer disposed on the substrate.

An exemplary embodiment of the present invention provides a display device comprising: a substrate including a display area and a non-display area disposed around the display area; an organic light emitting diode disposed on the substrate in the display area; and a spacer disposed on the substrate in the non-display area, the substrate includes a first insulating film and a second insulating film disposed on the first insulating film, the substrate includes a groove disposed in an edge area farther from the organic light emitting diode than the spacer in the non-display area, and the groove is formed in at least one of the first insulating film and the second insulating film.

The display device may further include an encapsulation layer disposed on the substrate, the encapsulation layer may include an inorganic encapsulation layer and an organic encapsulation layer, and the inorganic encapsulation layer of the encapsulation layer may overlap the groove of the substrate.

The organic encapsulation layer of the encapsulation layer may not overlap the groove of the substrate.

The organic encapsulation layer of the encapsulation layer may overlap a portion of the groove of the substrate.

An exemplary embodiment of the present invention provides a display device comprising: a substrate including a display area and a non-display area disposed around the display area; an organic light emitting diode disposed on the substrate in the display area; and an encapsulation layer disposed on the substrate in the display area and in the non-display area and including a plurality of inorganic encapsulation layers and organic encapsulation layers. The substrate includes a first insulating film and a second insulating film disposed on the first insulating film. The substrate includes a groove disposed in a region that overlaps the plurality of inorganic encapsulation layers of the encapsulation layer in the non-display area, and the groove is formed in at least one of the first insulating film and the second insulating film.

The organic encapsulation layer of the encapsulation layer may not overlap the groove of the substrate.

The organic encapsulation layer of the encapsulation layer may overlap a portion of the groove of the substrate.

An exemplary embodiment of the present invention provides a manufacturing method of a display device, comprising: forming an organic light emitting diode in a display area of a substrate; forming a spacer in a non-display area of the substrate; forming a groove in an edge area of the substrate farther from the emission portion than the spacer in the non-display area; and forming an encapsulation layer on the substrate.

The groove of the substrate may be formed by using a laser.

An exemplary embodiment of the present invention provides a manufacturing method of a display device, including: stacking a plurality of insulating layers on a substrate that includes a display area and a non-display area disposed around the display area, forming a plurality of contact holes in the plurality of insulating layers located in the display area, and forming a first groove in the plurality of insulating layers located in the non-display area; forming an emission portion in the display area; forming a spacer in the non-display area; forming a second groove in the substrate to be aligned with the first groove in the non-display area; and forming an encapsulation layer on the substrate.

The groove of the substrate may be formed in an edge area farther from the organic light emitting diode than the spacer.

The second groove of the substrate may be formed by using a laser.

The second groove of the substrate may be formed by etching the substrate with the insulating layers having the first grooves as an etching mask.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
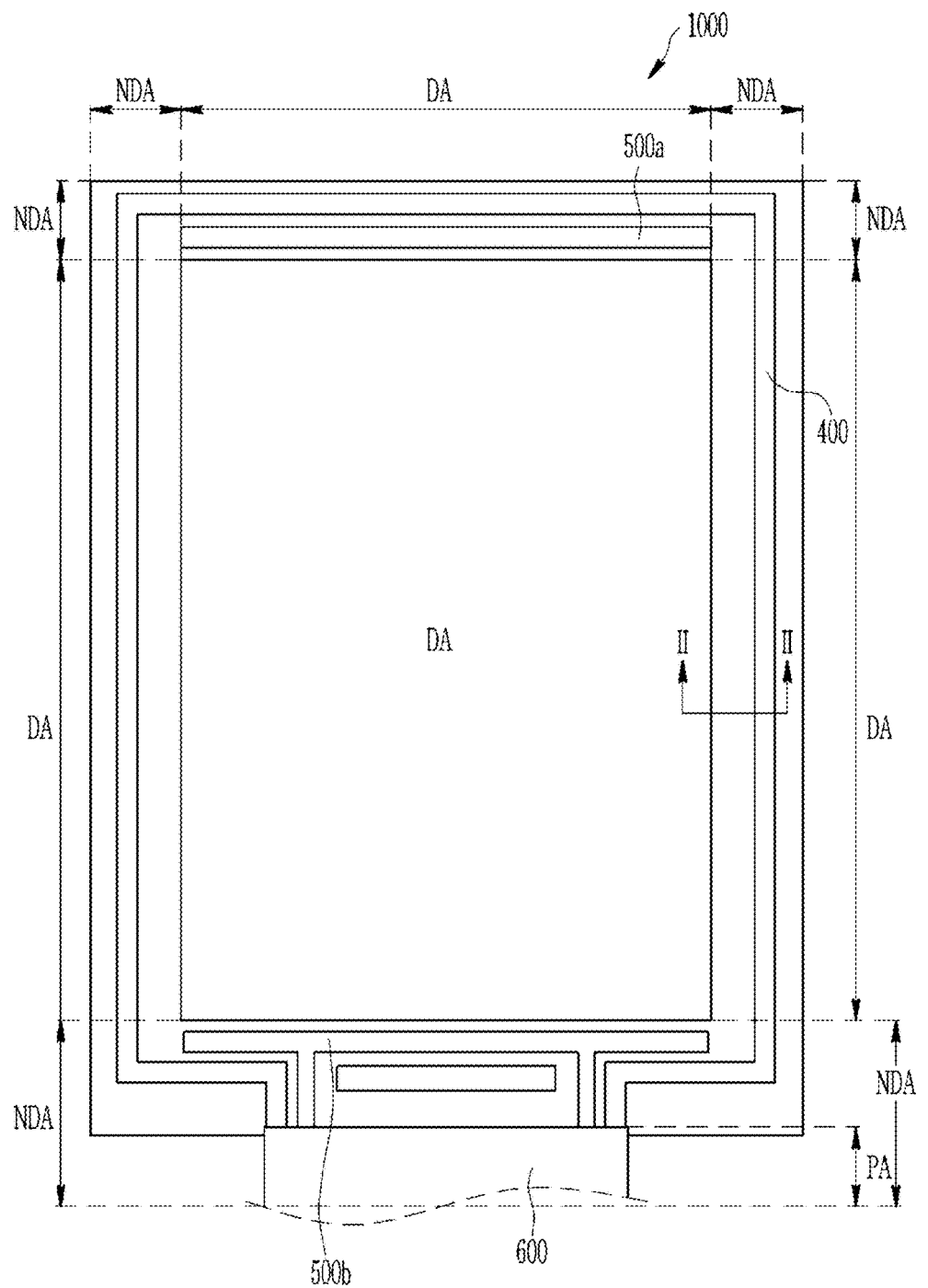
FIG. 1 is a top plan view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Further, in the specification, the phrase "in a plan view" means when an object portion is viewed from above, and the phrase "in a cross-sectional view" means when a cross-section taken by vertically cutting an object portion is viewed from the side.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
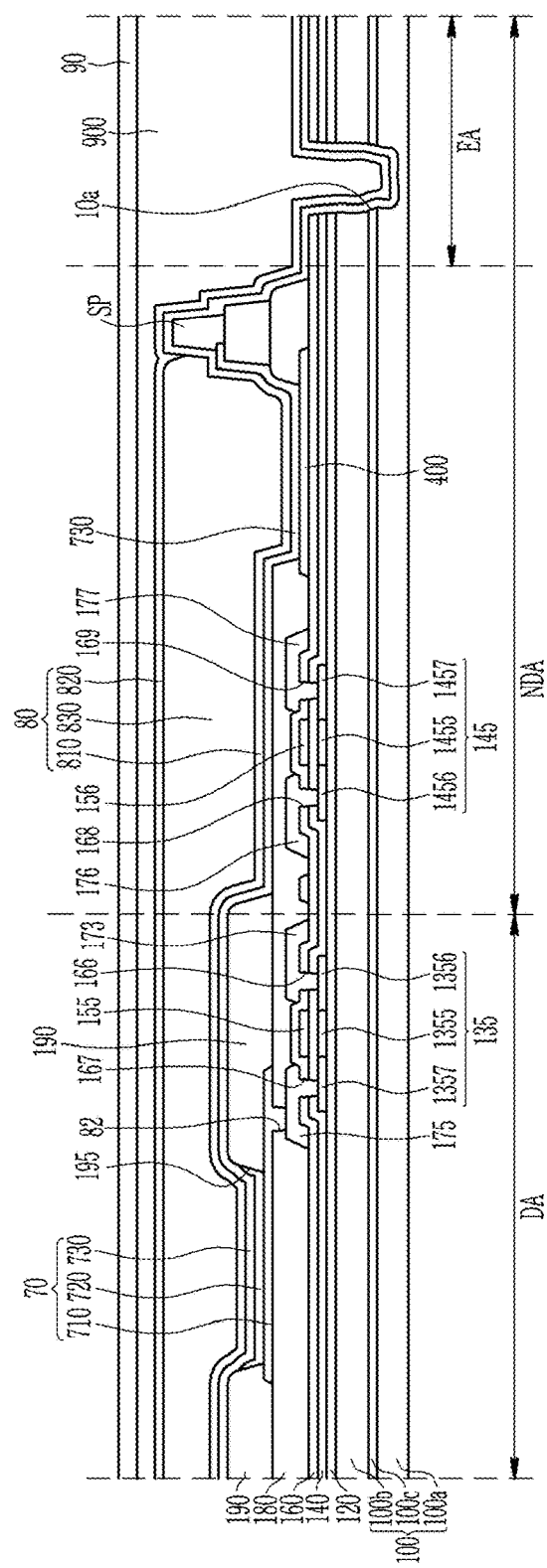
FIG. 2 is a schematic cross-sectional view taken along a line II-II of FIG. 1.
Figure 3:
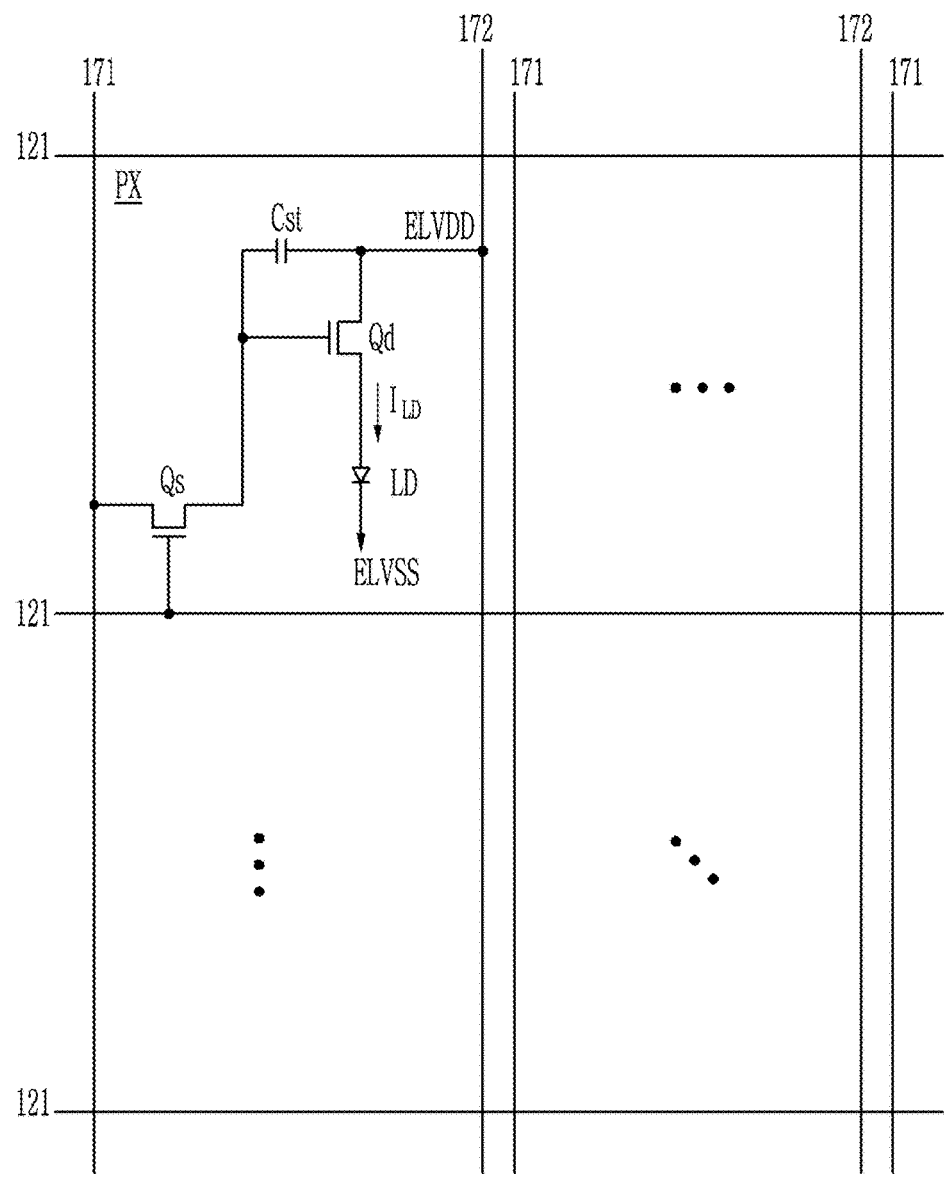
FIG. 3 illustrates an example of an equivalent circuit diagram of one pixel of a display device according to an exemplary embodiment.

Hereinafter, a display device according to an exemplary embodiment will be described with reference to FIG. 1, FIG. 2, and FIG. 3. FIG. 1 is a top plan view illustrating a display device according to an exemplary embodiment. FIG. 2 is a schematic cross-sectional view taken along a line II-II of FIG. 1. FIG. 3 illustrates an example of an equivalent circuit diagram of one pixel of a display device according to an exemplary embodiment.

Referring to FIG. 1, according to the present exemplary embodiment, the display device 1000 includes a display area DA for displaying an image and a non-display area NDA disposed at an outer circumference of the display area DA.

The non-display area NDA includes a driving area PA in which a driver 600 for transferring a signal to the display area DA is disposed.

A common voltage transfer line 400 for transferring a common voltage and driving voltage transfer lines 500a and 500b are disposed in the non-display area NDA.

In the illustrated exemplary embodiment, the common voltage transfer line 400 surrounds the display area DA along the non-display area NDA from the driver 600, and the driving voltage transfer lines 500a and 500b include two portions that are separated from each other with the display area DA therebetween. However, the disposal of the common voltage transfer line 400 and the driving voltage transfer lines 500a and 500b illustrated in FIG. 1 is merely an example, and the present invention is not limited thereto.

A structure of the display area DA and the non-display area NDA will now be described with reference to FIG. 2 and FIG. 3.

Referring to FIG. 3, according to the present exemplary embodiment, the display area DA of the display device 1000 includes a plurality of signal lines 121, 171, and 172 and a plurality of pixels PX connected with the signal lines 121, 171, and 172 and arranged in a substantially matrix form. Each pixel indicates a minimum unit for displaying an image, and the display device displays images by using the pixels.

The signal lines include a plurality of gate lines 121 for transferring gate signals (or scan signals), a plurality of data lines 171 for transferring data signals, and a plurality of driving voltage lines 172 for transferring driving voltages ELVDD. The gate lines 121 extend substantially in a row direction, and are substantially parallel to each other. Vertical-direction portions of the data line 171 and the driving voltage line 172 extend substantially in a column direction, and are substantially parallel to each other.

Each pixel PX includes a switching thin film transistor Qs, a driving thin film transistor Qd, a storage capacitor Cst, and an organic light emitting element LD. Although not illustrated, one pixel PX may further include a thin film transistor and a capacitor for compensating a current supplied to the organic light emitting element.

The switching thin film transistor Qs has a control terminal, an input terminal, and an output terminal. The control terminal is connected with the gate line 121, the input terminal is connected with the data line 171, and the output terminal is connected with the driving thin film transistor Qd. The switching thin film transistor Qs transfers a data signal applied to the data line 171 to the driving thin film transistor Qd in response to a scan signal applied to the gate line 121.

The driving thin film transistor Qd also has a control terminal, an input terminal, and an output terminal. The control terminal is connected with the switching thin film transistor Qs, the input terminal is connected with the driving voltage line 172, and the output terminal is to connected with the organic light emitting element LD. The driving thin film transistor Qd passes an output current $I_{LD}$ having a magnitude that is changed depending on a voltage applied between the control terminal and the output terminal.

The capacitor Cst is connected between the control terminal and the input terminal of the driving thin film transistor Qd. The capacitor Cst charges a data signal applied to the control terminal of the driving thin film transistor Qd and maintains it after the switching thin film transistor Qs is turned off.

The organic light emitting element LD has an anode connected with the output terminal of the driving thin film transistor Qd and a cathode connected with the common voltage ELVSS. The organic light emitting element LD emits light by varying a magnitude thereof depending on the output current $I_{LD}$ of the driving thin film transistor Qd, thereby displaying images.

An interlayer structure of the display device 1000 will now be described with reference to FIG. 2.

As described above, the display device 1000 includes a display area DA and a non-display area NDA. As shown in FIG. 2, the display area NDA includes an edge area EA of an outer circumferential portion.

The display device 1000 includes a substrate 100, which includes a first insulating film 100a and a second insulating film 100b that are flexible and overlap each other. The first insulating film 100a and the second insulating film 100b may include a polyimide. However, the first insulating film 100a and the second insulating film 100b are not limited thereto, and may include other materials having good heat resistance, chemical resistance, abrasion resistance, and flexibility.

The substrate 100 may further include a first barrier film 100c disposed between the first insulating film 100a and the second insulating film 100b. The first barrier film 100c prevents moisture or gas from flowing from the outside between the first insulating film 100a and the second insulating film 100b, to prevent deformation of the first insulating film 100a and the second insulating film 100b.

The substrate 100 may prevent its performance from deteriorating by including the first insulating film 100a and the second insulating film 100b when the first insulating film 100a which is in contact with the outside is damaged. For example, damage may occur at an interface between the substrate 100 and a supporting substrate which supports the substrate 100 in a step of separating the substrate 100 from the supporting substrate after a manufacturing process of the substrate 100 is completed during the process of manufacturing the display device. However, the substrate 100 of the display device 1000 according to the present exemplary embodiment may include the first insulating film 100a and the second insulating film 100b which overlap each other, so that even when a portion of the first insulating film 100a adjacent to the supporting substrate is damaged, the second insulating film 100b remains. Thus, it is possible to improve reliability of the substrate 100.

A groove 10a is formed in the substrate 100 disposed in the non-display area NDA. The groove 10a may be formed in the second insulating film 100b. In addition, the groove 10a may be formed in at least a portion of the first insulating film 100a. The groove 10a is disposed in an edge area EA of an outer circumferential portion of the non-display area NDA. The edge area EA is an area farther from the display area DA than the area where the spacer SP is disposed in the non-display area NDA.

A buffer layer 120 is disposed on the substrate 100. The buffer layer 120 may include a single layer of an insulating layer such as a silicon nitride (SiNx) or a silicon oxide (SiOx), or a plurality of multilayers in which a silicon nitride (SiNx) and a silicon oxide (SiOx) are stacked. The buffer layer 120 prevents penetration of undesired components such as impurities or moisture.

A second barrier film (not illustrated) may be disposed between the second insulating film 100b and the buffer layer 120.

A first semiconductor layer 135 is disposed on the buffer layer 120 of the display area DA. The first semiconductor layer 135 may include polysilicon or an oxide semiconductor. In this case, the oxide semiconductor may include an oxide such as one of titanium (Ti), hafnium (Hf), zirconium (Zr), aluminum (Al), tantalum (Ta), germanium (Ge), zinc (Zn), gallium (Ga), tin (Sn), or indium (In), or a composite oxide thereof.

The first semiconductor layer 135 includes a first channel region 1355, and a first source region 1356 and a first drain region 1357 disposed at opposite sides of the first channel region 1355. The first channel region 1355 of the first semiconductor layer 135 may be a region where an impurity is not doped, and the first drain region 1357 of the first semiconductor layer 135 may be regions doped with a conductive impurity.

Similarly, a second semiconductor layer 145 is disposed on the buffer layer 120 of the non-display area NDA. The second semiconductor layer 145 includes a second channel region 1455, and a second source region 1456 and a second drain region 1457 disposed at opposite sides of the second channel region 1455.

A gate insulating layer 140 is disposed on the first semiconductor layer 135 and the second semiconductor layer 145. The gate insulating layer 140 may be a single layer including tetraethyl orthosilicate (TEOS), a silicon oxide (SiOx), a silicon nitride (SiNx), or a silicon oxynitride (SiON), or a multilayer thereof.

A first gate electrode 155 and a second gate electrode 156 are disposed on the gate insulating layer 140. The first gate electrode 155 overlaps the first channel region 1355, and the second gate electrode 156 overlaps the second channel region 1455.

The first gate electrode 155 and the second gate electrode 156 may be the single layer or the multilayer, including a low resistance material such as aluminum (Al), titanium (Ti), molybdenum (Mo), copper (Cu), nickel (Ni), or alloys thereof, or a material having strong resistance to corrosion.

A first interlayer insulating layer 160 is disposed on the first gate electrode 155 and the second gate electrode 156. The first interlayer insulating layer 160 may be the single layer including tetraethyl orthosilicate (TEOS), a silicon oxide (SiOx), a silicon nitride (SiNx), or a silicon oxynitride (SiON), or a multilayer thereof.

The first interlayer insulating layer 160 and the gate insulating layer 140 have a first source contact hole 166 and a first drain contact hole 167 overlapping the first source region 1356 and the first drain region 1357, and a second source contact hole 168 and a second drain contact hole 169 overlapping the second source region 1456 and the second drain region 1457.

A first source electrode 173 and a first drain electrode 175, and a second source electrode 176 and a second drain electrode 177, are disposed on the first interlayer insulating layer 160. In addition, a common voltage transmitting line 400 is disposed on the first interlayer insulating layer 160 of the contact area CA of the non-display area NDA.

The first source electrode 173 and the first drain electrode 175 are connected to the first source region 1356 and the first drain region 1357 of the first semiconductor layer 135 through the first source contact hole 166 and the first drain contact hole 167, respectively. Similarly, the second source electrode 176 and the second drain electrode 177 are connected to the second source region 1456 and the second drain region 1457 of the second semiconductor layer 145 through the second source contact hole 168 and the second drain contact hole 169, respectively.

The first source electrode 173 and the first drain electrode 175, and the second source electrode 176 and the second drain electrode 177, may be the single layer or the multilayer, including a low resistance material such as aluminum (Al), titanium (Ti), molybdenum (Mo), copper (Cu), nickel (Ni), or alloys thereof, or a material having strong corrosion resistance. The common voltage transmitting line 400 may be simultaneously formed with the first source electrode 173, the first drain electrode 175, the second source electrode 176, and the second drain electrode 177.

The first semiconductor layer 135, the first gate electrode 155, the first source electrode 173, and the first drain electrode 175 of the display area DA form a driving thin film transistor Qd of the pixel PX shown in FIG. 3, and the second semiconductor layer 145, the second gate electrode 156, the second source electrode 176, and the second drain electrode 177 of the non-display area NDA form a thin film transistor included in a gate driver disposed at the non-display area NDA.

In FIG. 2, one transistor is respectively shown in each of the display area DA and the non-display area NDA, however this is for convenience of explanation, and the present invention is not limited thereto.

A second interlayer insulating layer 180 is formed on the first source electrode 173, the first drain electrode 175, the second source electrode 176, and the second drain electrode 177. The second interlayer insulating layer 180 may be the single layer including tetraethyl orthosilicate (TEOS), a silicon oxide (SiOx), a silicon nitride (SiNx), or a silicon oxynitride (SiON), or a multilayer thereof like the first interlayer insulating layer 160.

The second interlayer insulating layer 180 has a contact hole 82 overlapping the first drain electrode 175. The second interlayer insulating layer 180 is removed at a region overlapping the common voltage transmitting line 400 such that most of the common voltage transmitting line 400 does not overlap the second interlayer insulating layer 180 and only the edge part of the common voltage transmitting line 400 may overlap the second interlayer insulating layer 180. However, the entire common voltage transmitting line 400 may not overlap the second interlayer insulating layer 180.

A pixel electrode 710 is disposed on the second interlayer insulating layer 180. The pixel electrode 710 may be an anode of an organic light emitting diode of FIG. 3. In the present exemplary embodiment, the second interlayer insulating layer 180 is disposed between the pixel electrode 710 and the first drain electrode 175, however it may be disposed on the same layer as the pixel electrode 710 and the first drain electrode 175 and may be integrated with the first drain electrode 175.

A partition 190 is formed on the pixel electrode 710. The partition 190 has an opening 195 overlapping the pixel electrode 710. The partition 190 may include a resin such as a polyacrylate resin or a polyimide resin, a silica-based inorganic material, or the like.

An organic emission layer 720 is disposed in the opening 195 of the partition 190.

The organic emission layer 720 may include an emission layer and at least one of a hole injection layer (HIL), a hole transporting layer (HTL), an electron transporting layer (ETL), and an electron injection layer (EIL). In the case where the organic emission layer 720 includes all the layers, the hole-injection layer is disposed on the pixel electrode 710 which is an anode, and the hole transporting layer, the emission layer, the electron transporting layer, and the electron injection layer may be sequentially laminated thereon.

A common electrode 730 is disposed on the partition 190 and the organic emission layer 720. The common electrode 730 becomes a cathode of the organic light emitting diode. Accordingly, the pixel electrode 710, the organic emission layer 720, and the common electrode 730 constitute an organic light emitting diode 70.

The organic light emitting diode 70 may have any one structure of a top display type, a bottom display type, and a dual-sided display type according to a direction in which the organic light emitting diode 70 emits light.

In the case of the front display type, the pixel electrode 710 is formed of a reflective layer and the common electrode 730 is formed of a transflective or transmissive layer. In contrast, in the case of the rear display type, the pixel electrode 710 is formed of a transflective layer and the common electrode 730 is formed of a reflective layer. In the case of the dual-sided display type, the pixel electrode 710 and the common electrode 730 are formed of a transparent layer or a transflective layer. The reflective layer and the transflective layer may be made of at least one metal of magnesium (Mg), silver (Ag), gold (Au), calcium (Ca), lithium (Li), chromium (Cr), and aluminum (Al), or alloys thereof. The reflective layer and the transflective layer are determined by the thicknesses thereof, and the transflective layer may have a thickness of less than 200 nm. While the transmittance of the reflective layer or transflective layer increases as the thickness thereof decreases, the resistance thereof increases when the layer is excessively thin. The transparent layer is made of a material of indium tin oxide (ITO), indium zinc oxide (IZO), zinc oxide (ZnO), indium oxide, or the like.

The common electrode 730 may be disposed on an entire surface of the substrate 100 including the display area DA and the non-display area NDA, and contacts the common voltage transfer line 400 of the non-display area NDA to receive a common voltage.

A spacer SP is disposed outside the common voltage transfer line 400 of the non-display area NDA. The spacer SP may be formed of the insulating layer made of a same layer as the second interlayer insulating layer and a pixel definition layer disposed in the display area DA, and an additional insulating layer.

An encapsulation layer 80 is disposed on the common electrode 730. The encapsulation layer 80 may be formed by alternately depositing at least one inorganic layer and at least one organic layer, and a plurality of inorganic layers or a plurality of organic layers may be formed.

In the illustrated exemplary embodiment, the encapsulation layer 80 includes a first inorganic encapsulation layer 810 and a second inorganic encapsulation layer 820, and an organic encapsulation layer 830 disposed between the first inorganic encapsulation layer 810 and the second inorganic encapsulation layer 820.

The first inorganic encapsulation layer 810 and the second inorganic encapsulation layer 820 may be formed on the entire surface of the substrate 100 to be disposed on the spacer SP and in the edge area EA. However, the organic encapsulation layer 830 may not be disposed in the edge area EA disposed at an outer circumference of the spacer SP in the non-display area NDA.

As described above, a groove 10a is formed in the substrate 100 disposed in the outer circumference of the spacer SP, and a first inorganic encapsulation layer 810 and a second inorganic encapsulation layer 820 of the encapsulation layer 80 disposed in the edge area EA overlap the groove 10a. Herein, the outer circumference indicates an edge far from the display area.

A surface of the substrate 100 contacted by the first inorganic encapsulation layer 810 and the second inorganic encapsulation layer 820 has a non-smooth and uneven structure by the groove 10a formed in the substrate 100 disposed in the edge area EA, and a surface area (or contact area) of the substrate 100 contacted by the first inorganic encapsulation layer 810 and the second inorganic encapsulation layer 820 is widened.

As a result, a contact force between the substrate 100 and the first inorganic encapsulation layer 810 and the second inorganic encapsulation layer 820 of the encapsulation layer 80 is increased. Thus, compared with a case where the groove 10a is not formed in the substrate 100, it is possible to prevent the first inorganic encapsulation layer 810 and the second inorganic encapsulation layer 820 of the encapsulation layer 80 from lifting from the substrate 100 by increasing the contact force between the substrate 100 and the first inorganic encapsulation layer 810 and the second inorganic encapsulation layer 820 of the encapsulation layer 80, even when a width of the edge area EA is reduced.

An additional plate 90 such as a polarizer and a touch unit is disposed on the encapsulation layer 80, and an adhesive layer 900 is disposed between the encapsulation layer 80 and the additional plate 90.

The aforementioned structure of one pixel disposed in the display area DA illustrated in FIG. 2 and FIG. 3 is merely an example, and the pixel structure of the display device according to an exemplary embodiment of the present invention is not limited to the structure illustrated in FIG. 2 and FIG. 3. The signal line and the organic light emitting element may be formed with various configurations within a range that can be easily modified or realized by a person skilled in the art. For example, in FIG. 3, a display device including two thin film transistors (TFT) and one capacitor in one pixel is illustrated as a display device, but the present invention is not limited thereto. Thus, the number of thin film transistors, the number of capacitors, and the number of wires are not limited in the display device.

As illustrated in FIG. 2, according to the present exemplary embodiment, the substrate 100 of the display device includes the groove 10a disposed in the edge area EA of the non-display area NDA. The surface of the substrate 100 has a non-smooth and uneven structure by the groove 10a, the surface area of the substrate 100 of the edge area EA is widened, and the thin film first inorganic encapsulation layer 810 and the second inorganic encapsulation layer 820 of the encapsulation layer 80 disposed in the edge area EA overlap the groove 10a. Thus, compared with a case where the groove 10a is not formed in the substrate 100, it is possible to prevent the first inorganic encapsulation layer 810 and the second inorganic encapsulation layer 820 of the encapsulation layer 80 from lifting from the substrate 100 by increasing the contact force between the substrate 100 and the first inorganic encapsulation layer 810 and the second inorganic encapsulation layer 820 of the encapsulation layer 80, even when a width of the edge area EA is reduced (i.e., a substrate with a small edge area).

Figure 4:
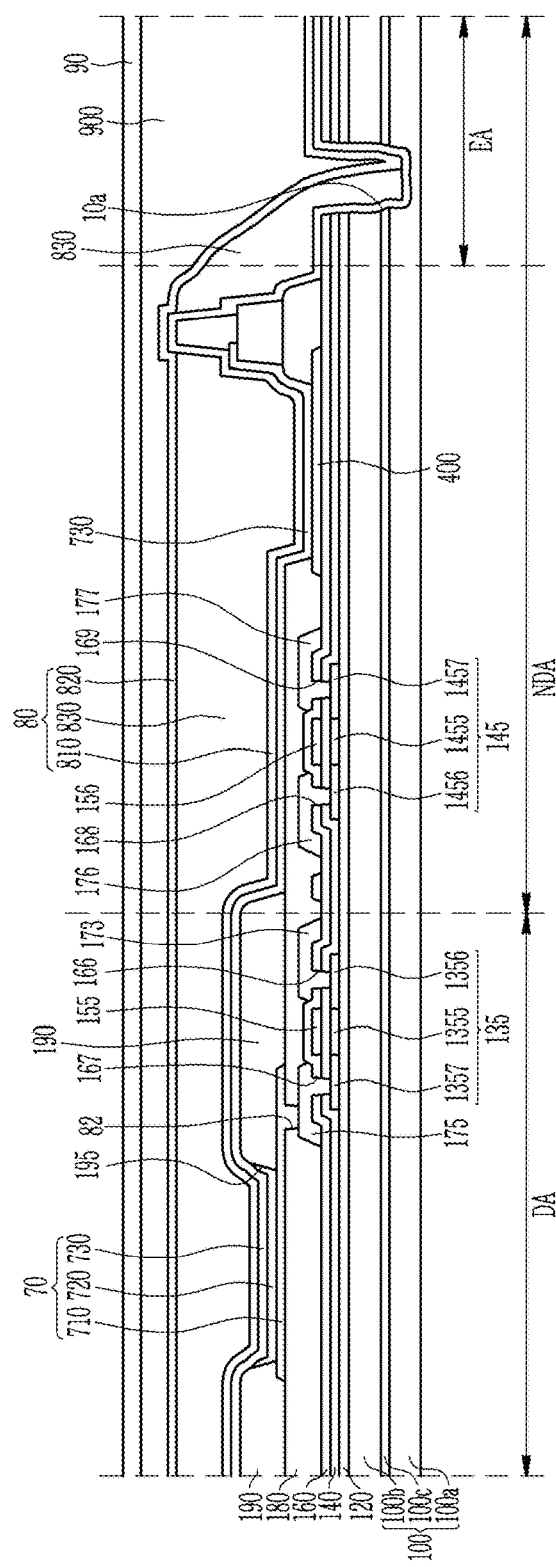
FIG. 4 is a schematic cross-sectional view illustrating a display device according to an exemplary embodiment.

A display device according to an exemplary embodiment will now be described with reference to FIG. 4. FIG. 4 is a schematic cross-sectional view illustrating a display device according to an exemplary embodiment.

Referring to FIG. 4, the display device according to the exemplary embodiment illustrated in FIG. 4 is similar to the display device according to the exemplary embodiment illustrated in FIG. 2. Detailed description of the same constituent elements is omitted.

In the display device according to the exemplary embodiment illustrated in FIG. 4, the encapsulation layer 80 of the organic encapsulation layer 830 is partially disposed in the groove 10a of the edge area EA beyond the spacer SP.

When the organic encapsulation layer 830 is formed, the spacer SP may serve as a dam to prevent overflowing of the organic material, and the organic material may be formed so as to not overflow the spacer SP. Even when some of the organic material is formed to overflow the spacer SP, it may not move further beyond the groove 10a by a step of the groove 10a formed in the substrate 100. In addition, the organic encapsulation layer 830 is disposed on a portion of the first inorganic encapsulation layer 810 of the encapsulation layer 80 which overlaps the groove 10a of the substrate 100 disposed in the edge area EA, and thus the first inorganic encapsulation layer 810 is more firmly attached on the substrate 100 while the organic encapsulation layer 830 is cured. Accordingly, it is possible to prevent the first inorganic encapsulation layer 810 and the second inorganic encapsulation layer 820 of the encapsulation layer 80 disposed in the edge area EA from lifting from the substrate 100.

According to the present exemplary embodiment, the substrate 100 of the display device includes the groove 10a disposed in the edge area EA of the non-display area NDA. The surface of the substrate 100 has a non-smooth and uneven structure by the groove 10a, the surface area of the substrate 100 of the edge area EA is widened, and the thin film first inorganic encapsulation layer 810 and the second inorganic encapsulation layer 820 of the encapsulation layer 80 disposed in the edge area EA overlap the groove 10a. Thus, compared with a case where the groove 10a is not formed in the substrate 100, it is possible to prevent the first inorganic encapsulation layer 810 and the second inorganic encapsulation layer 820 of the encapsulation layer 80 from lifting from the substrate 100 by increasing the contact force between the substrate 100 and the first inorganic encapsulation layer 810 and the second inorganic encapsulation layer 820 of the encapsulation layer 80, even when a width of the edge area EA is reduced.

Many features of the display device according to the exemplary embodiment described with reference to FIG. 1, FIG. 2, and FIG. 3 are applicable to the display device according to the present exemplary embodiment.

Figure 5:
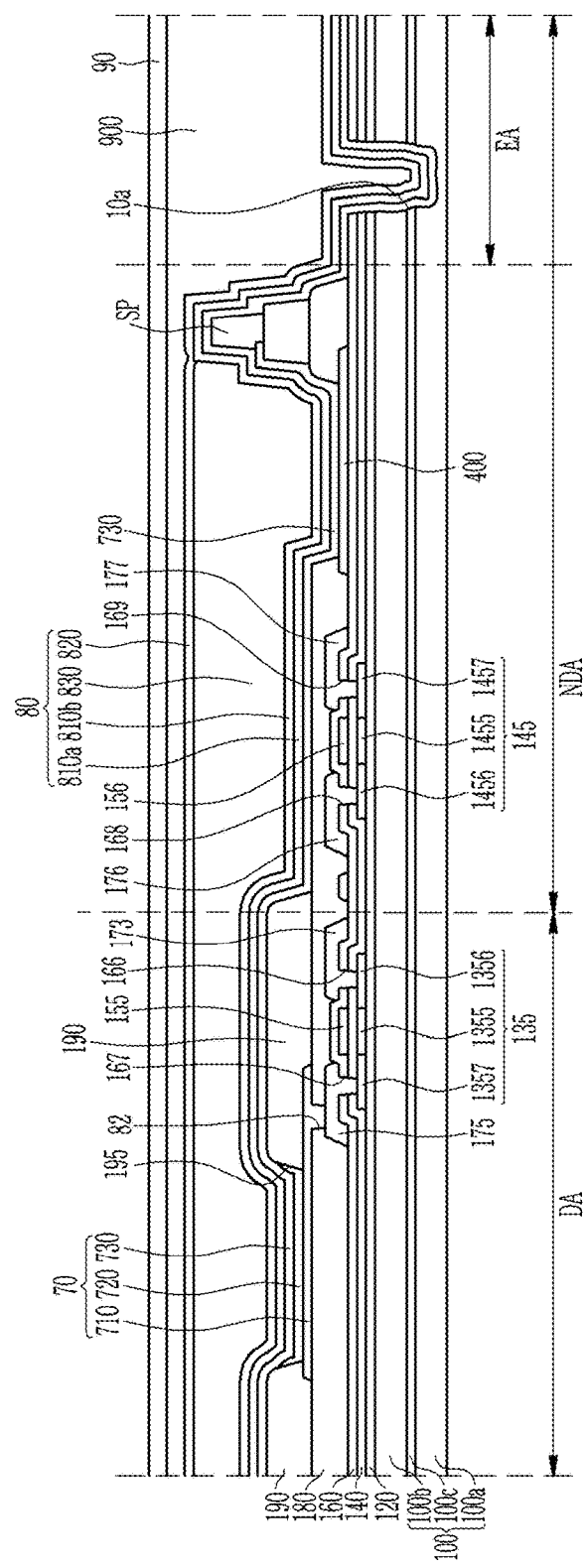
FIG. 5 is a schematic cross-sectional view illustrating a display device according to an exemplary embodiment.

A display device according to an exemplary embodiment will now be described with reference to FIG. 5. FIG. 5 is a schematic cross-sectional view illustrating a display device according to an exemplary embodiment.

Referring to FIG. 5, the display device according to the exemplary embodiment illustrated in FIG. 5 is similar to the display device according to the exemplary embodiment illustrated in FIG. 2. Detailed description of the same constituent elements is omitted.

In the display device according to the exemplary embodiment illustrated in FIG. 5, a first inorganic encapsulation layer 810 of the encapsulation layer 80 includes a first inorganic layer 810a and a second inorganic layer 810b. For example, the first inorganic layer 810a may include a silicon oxide, and the second inorganic layer 810b may include a silicon nitride film. However, the first inorganic layer 810a and the second inorganic layer 810b are not limited thereto and may include different materials.

According to the present exemplary embodiment, the substrate 100 of the display device includes the groove 10a disposed in the edge area EA of the non-display area NDA.

The surface of the substrate 100 has a non-smooth and uneven structure by the groove 10a, the surface area of the substrate 100 of the edge area EA is widened, and the thin film first inorganic encapsulation layer 810 and the second inorganic encapsulation layer 820 of the encapsulation layer 80 disposed in the edge area EA overlap the groove 10a. Thus, compared with a case where the groove 10a is not formed in the substrate 100, it is possible to prevent the first inorganic encapsulation layer 810 and the second inorganic encapsulation layer 820 of the encapsulation layer 80 from lifting from the substrate 100 by increasing the contact force between the substrate 100 and the first inorganic encapsulation layer 810 and the second inorganic encapsulation layer 820 of the encapsulation layer 80, even when a width of the edge area EA is reduced.

Many features of the display device according to the exemplary embodiment described with reference to FIG. 1, FIG. 2, and FIG. 3 and the display device according to the exemplary embodiment described with reference to FIG. 4 are applicable to the display device according to the present exemplary embodiment.

Figure 6:
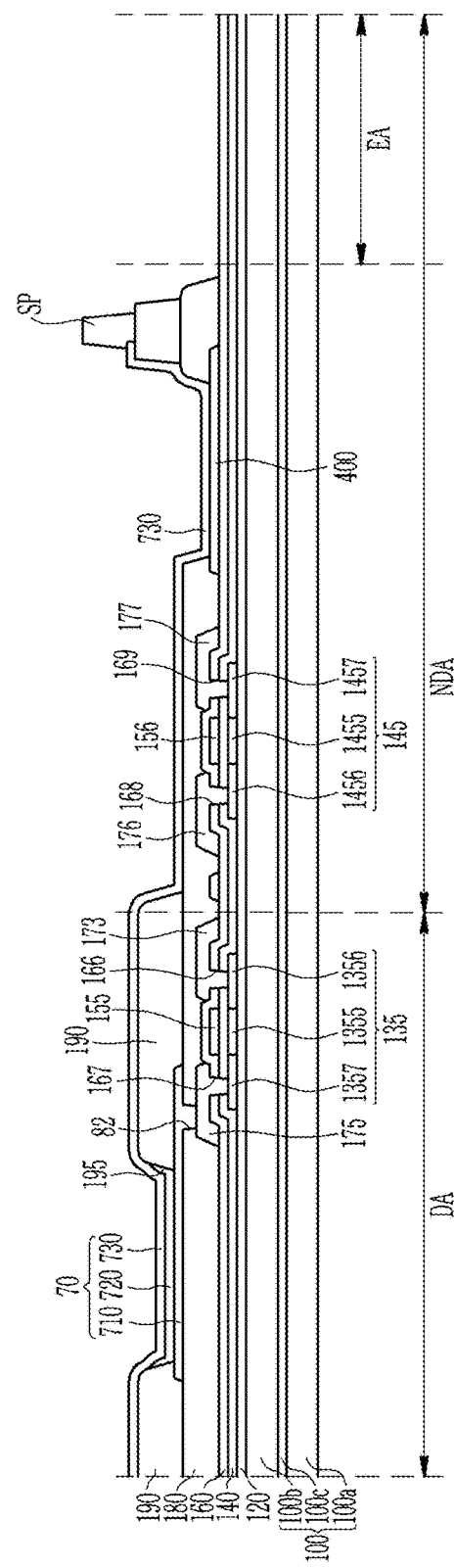
FIG. 6 and FIG. 7 are cross-sectional views for describing a manufacturing method of a display device according to an exemplary embodiment.
Figure 7:
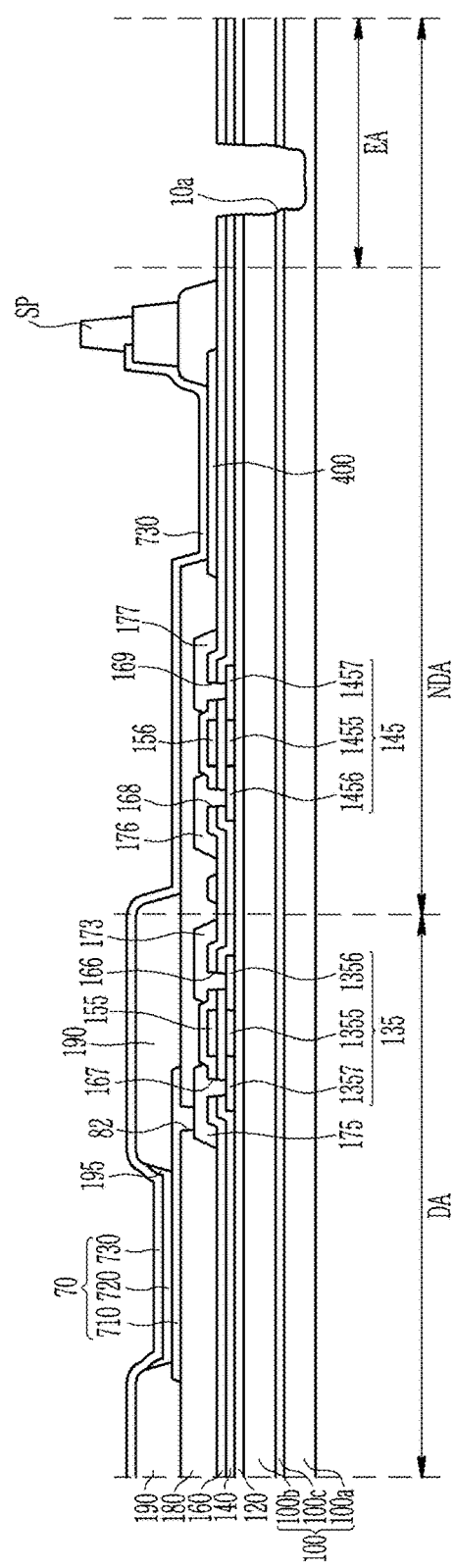

Hereinafter, a manufacturing method of a display device according to an exemplary embodiment will be described with reference to FIG. 6 and FIG. 7 as well as FIG. 2. FIG. 6 and FIG. 7 are cross-sectional views for describing a manufacturing method of a display device according to an exemplary embodiment.

Referring to FIG. 6, a buffer layer 120, a first semiconductor layer 135 and a second semiconductor layer 145, a gate insulating layer 140, a first gate electrode 155 and a second gate electrode 156, a first interlayer insulating layer 160, a first source electrode 173 and a first drain electrode 175, a second source electrode 176 and a second drain electrode 177, a common voltage transfer line 400, a second interlayer insulating layer 180, a pixel electrode 710, a partition 190, an organic emission layer 720, a common electrode 730, and a spacer SP are formed on a substrate 100 including a first insulating film 100a, a second insulating film 100b, and a first barrier film 100c disposed between the first insulating film 100a and the second insulating film 100b. In an edge area EA, the buffer layer 120, the gate insulating layer 140, and the first interlayer insulating layer 160 are disposed on the substrate 100.

Next, referring to FIG. 7, a groove 10a is formed in the substrate 100 disposed in the edge area EA. In FIG. 7, it is illustrated that the groove 10a of the substrate 100 is formed in at least a portion of the first insulating film 100a as well as the second insulating film 100b, but it may only be formed in the second insulating film 100b. The groove 10a of the substrate 100 may be formed by using laser.

After the groove 10a is formed in the substrate 100 disposed in the edge area EA, an encapsulation layer 80, an adhesive layer 900, and an additional plate 90 are formed as illustrated in FIG. 2.

In accordance with the manufacturing method of the display device according to the present exemplary embodiment, the groove 10a is formed by using a laser in the substrate 100 disposed in the edge area EA before the encapsulation layer 80 is formed in the substrate 100. The groove 10a may be formed by using a laser to remove the buffer layer 120, the gate insulating layer 140, and the first interlayer insulating layer 160 disposed on the substrate 100 together. As such, since the groove 10a is formed by using a laser, a process for forming the groove 10a is simple, and no additional exposing mask is required. Accordingly, the increase in the manufacturing cost is not significant.

Figure 8:
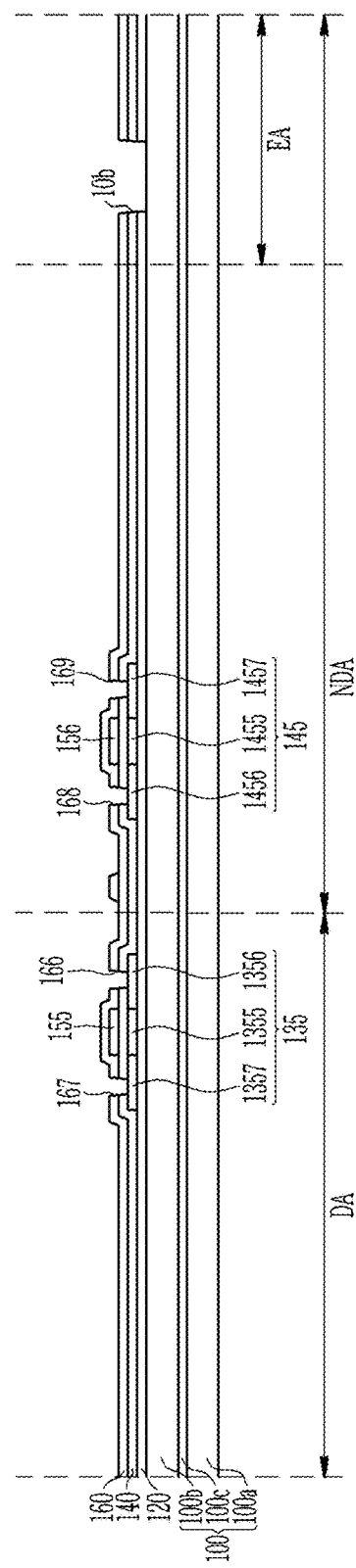
FIG. 8, FIG. 9, and FIG. 10 are cross-sectional views for describing a manufacturing method of a display device according to an exemplary embodiment.
Figure 9:
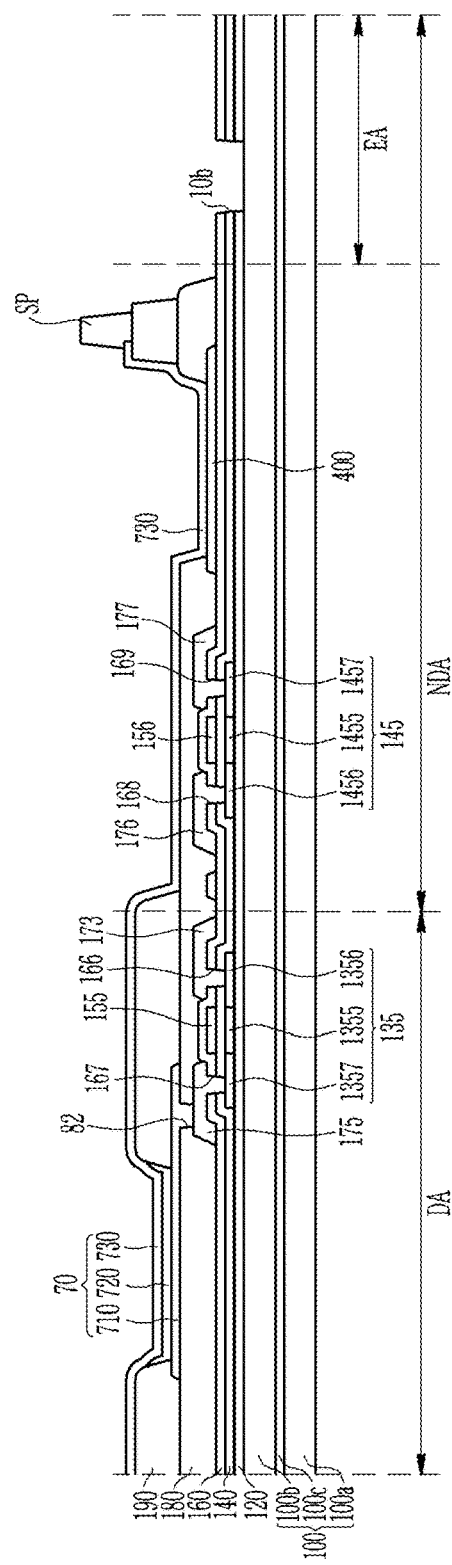
Figure 10:
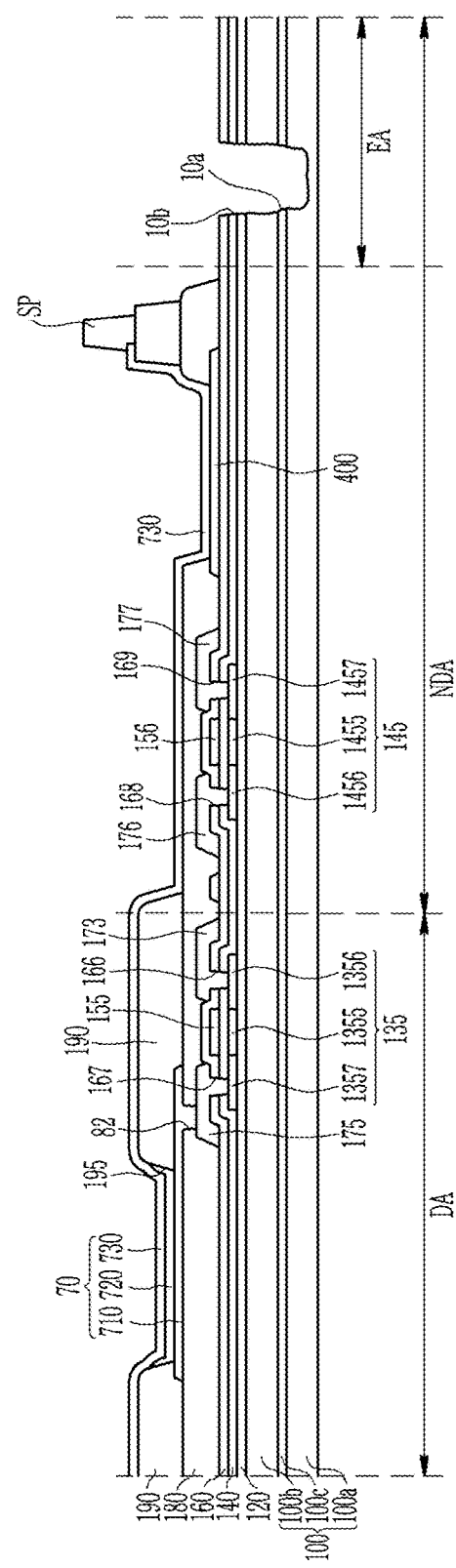

Hereinafter, a manufacturing method of a display device according to an exemplary embodiment will be described with reference to FIG. 8, FIG. 9, and FIG. 10 as well as FIG. 2. FIG. 8, FIG. 9, and FIG. 10 are cross-sectional views for describing a manufacturing method of a display device according to an exemplary embodiment.

Referring to FIG. 8, a buffer layer 120, a first semiconductor layer 135 and a second semiconductor layer 145, a gate insulating layer 140, a first gate electrode 155 and a second gate electrode 156, and a first interlayer insulating layer 160 are formed on a substrate 100 including a first insulating film 100a, a second insulating film 100b, and a first barrier film 100c disposed between the first insulating film 100a and the second insulating film 100b. A first source contact hole 166 and a first drain contact hole 167 which overlap a first source region 1356 and a first drain region 1357 and a second source contact hole 168 and a second drain contact hole 169 which overlap a second source region 1456 and a second drain region 1457 are formed in the first interlayer insulating layer 160 and the gate insulating layer 140, and a first groove 10b is formed in the buffer layer 120, the gate insulating layer 140, and the first interlayer insulating layer 160 of the edge area EA.

Next, referring to FIG. 9, a first source electrode 173 and a first drain electrode 175, a second source electrode 176 and a second drain electrode 177, a common voltage transfer line 400, a second interlayer insulating layer 180, a pixel electrode 710, a partition 190, an organic emission layer 720, a common electrode 730, and a spacer SP are formed.

Next, referring to FIG. 10, a second groove 10a is formed in the substrate 100 so as to be aligned with the first groove 10b formed in the buffer layer 120, the gate insulating layer 140, and the first interlayer insulating layer 160. In this case, the substrate 100 which overlaps the first groove 10b may be etched by using the gate insulating layer 140, the first interlayer insulating layer 160, and the buffer layer 120 in which the first groove 10b is not formed as a mask to form the second groove 10a, and the second groove 10a which overlaps the first groove 10b may be formed by using a laser.

In accordance with the manufacturing method of the display device according to the present exemplary embodiment, the first groove 10b of the buffer layer 120, the gate insulating layer 140, and the first interlayer insulating layer 160 are formed together with the first source contact hole 166 and the first drain contact hole 167 and the second source contact hole 168 and the second drain contact hole 169. The second groove 10a of the substrate 100 is etched by using the buffer layer 120, the gate insulating layer 140, and the first interlayer insulating layer 160 having the first groove 10b as a mask or by using a laser. As a result, no additional exposing mask is required. Accordingly, the increase manufacturing cost is not significant.

Next, as illustrated in FIG. 2, the encapsulation layer 80, the adhesive layer 900, and the additional plate 90 are formed.

As such, in accordance with the manufacturing method of the display device according to the present exemplary embodiment, it is possible to form the groove 10a in the substrate 100 without adding an exposure mask.

Figure 11:
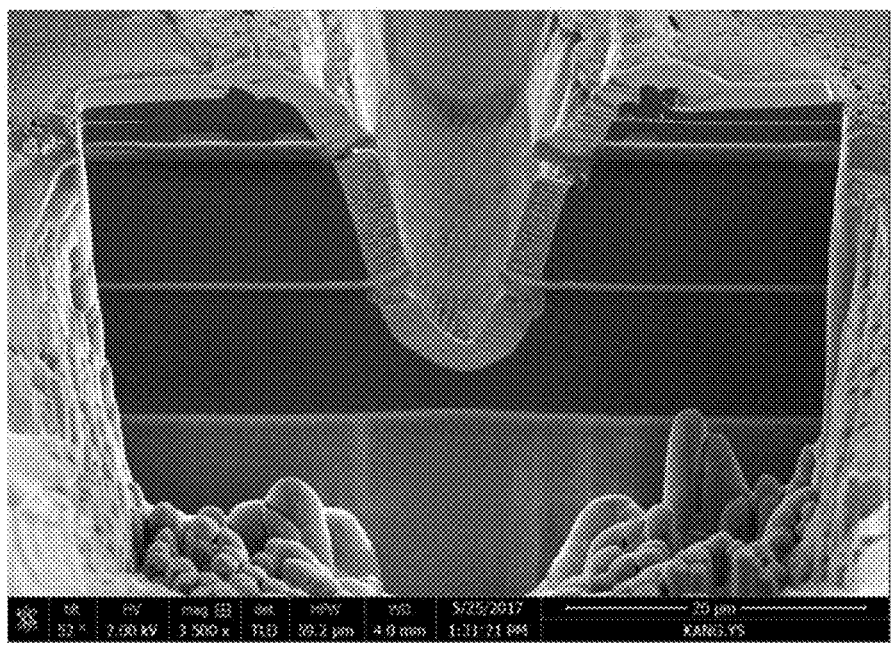
FIG. 11 and FIG. 12 are electron microscopic photographs illustrating a portion of a contact region of a display device.
Figure 12:
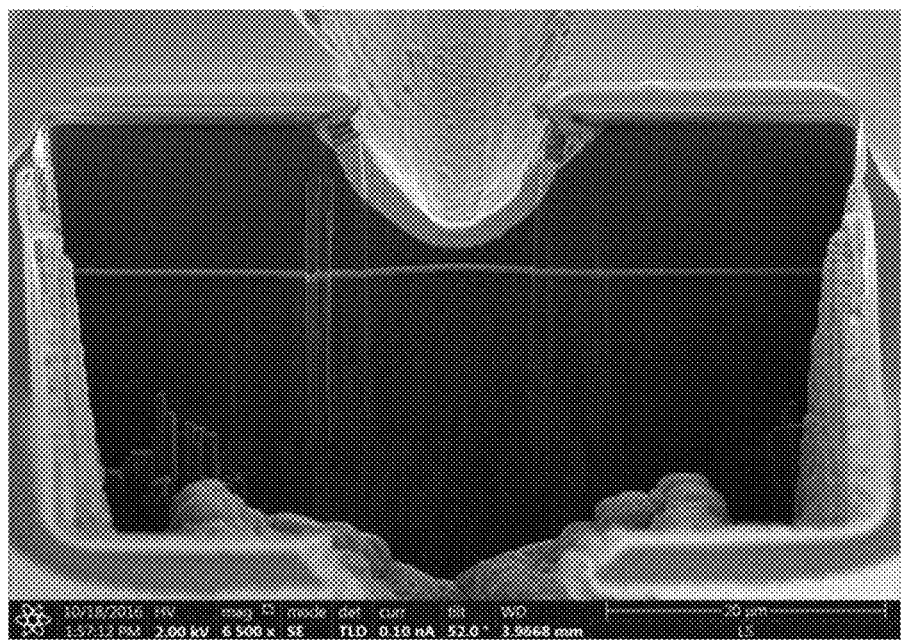

Hereinafter, an experimental example will be described with reference to FIG. 11 and FIG. 12. FIG. 11 and FIG. 12 are electron microscopic photographs illustrating a portion of a contact region of a display device.

In the present experimental example, a groove is formed in a substrate by using a laser. FIG. 11 illustrates a case that a groove is formed not only in the second insulating film 100b of the substrate 100 but also in the first barrier film 100c disposed below the second insulating film 100b and even in at least a portion of the first insulating film 100a, and FIG. 12 illustrates a case that a groove is formed in the second insulating film 100b of the substrate 100.

Referring to FIG. 11 and FIG. 12, the groove may be formed in the substrate by using a laser, may be formed to have a taper structure in which a layer stacked thereon is not disconnected, and a surface of the substrate may not be smooth and a surface area of the substrate may be widened.

As described above, according to the present exemplary embodiment, the substrate 100 of the display device includes the groove 10a disposed in the edge area EA of the non-display area NDA. The surface of the substrate 100 has a non-smooth and uneven structure by the groove 10a, the surface area of the substrate 100 of the edge area EA is widened, and the thin film first inorganic encapsulation layer 810 and the second inorganic encapsulation layer 820 of the encapsulation layer 80 disposed in the edge area EA overlap the groove 10a. Thus, compared with a case where the groove 10a is not formed in the substrate 100, it is possible to prevent the first inorganic encapsulation layer 810 and the second inorganic encapsulation layer 820 of the encapsulation layer 80 from lifting from the substrate 100 by increasing the contact force between the substrate 100 and the first inorganic encapsulation layer 810 and the second inorganic encapsulation layer 820 of the encapsulation layer 80, even when a width of the edge area EA is reduced.

According to the exemplary embodiments, it is possible to protect the display device such that the insulating layer may not be lifted in the peripheral portion of the display area without increasing the width of the non-display area disposed around the display area of the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate comprising a display area and a non-display area disposed around the display area;
   an organic light emitting diode disposed on the substrate in the display area; and
   a spacer disposed on the substrate in the non-display area,
   wherein the substrate comprises a first insulating film and a second insulating film disposed on the first insulating film,
   wherein the substrate comprises a groove disposed in an edge area farther from the organic light emitting diode than the spacer, and
   wherein the groove is formed in at least one of the first insulating film and the second insulating film.

2. The display device of claim 1, further comprising an encapsulation layer disposed on the substrate,
   wherein the encapsulation layer comprises an inorganic encapsulation layer and an organic encapsulation layer, and
   wherein the inorganic encapsulation layer of the encapsulation layer overlaps the groove of the substrate.

3. The display device of claim 2, wherein the organic encapsulation layer of the encapsulation layer does not overlap with the groove of the substrate.

4. The display device of claim 2, wherein the organic encapsulation layer of the encapsulation layer overlaps a portion of the groove of the substrate.

5. A display device comprising:
   a substrate comprising a display area and a non-display area disposed around the display area;
   an organic light emitting diode disposed on the substrate in the display area; and
   an encapsulation layer disposed on the substrate in the display area and in the non-display area and comprising a plurality of inorganic encapsulation layers and an organic encapsulation layer,
   wherein the substrate comprises a first insulating film and a second insulating film disposed on the first insulating film,
   wherein the substrate comprises a groove disposed in a region that overlaps with the plurality of inorganic encapsulation layers in the non-display area, and
   wherein the groove is formed in at least one of the first insulating film and the second insulating film.

6. The display device of claim 5, wherein the organic encapsulation layer of the encapsulation layer does not overlap the groove of the substrate.

7. The display device of claim 5, wherein the organic encapsulation layer of the encapsulation layer overlaps a portion of the groove of the substrate.

8. A manufacturing method of a display device, the method comprising:
   stacking a plurality of insulating layers on a substrate that comprises a display area and a non-display area disposed around the display area;
   forming a plurality of contact holes in the plurality of insulating layers located in the display area;
   forming a first groove in the plurality of insulating layers located in the non-display area;
   forming an organic light emitting diode in the display area;
   forming a spacer in the non-display area;
   forming a second groove in the substrate to be aligned with the first groove in the non-display area; and
   forming an encapsulation layer on the substrate.

9. The manufacturing method of claim 8, wherein the second groove is formed in an edge area farther from the organic light emitting diode than the spacer.

10. The manufacturing method of claim 9, wherein the second groove is formed by using a laser.

11. The manufacturing method of claim 9, wherein the second groove is formed by etching the substrate with the insulating layers having the first groove as an etching mask.

* * * * *